United States Patent
Hou et al.

(10) Patent No.: US 12,077,850 B2
(45) Date of Patent: Sep. 3, 2024

(54) PHYSICAL VAPOR DEPOSITION APPARATUS

(71) Applicant: Taiwan Semiconductor Manufacturing Company Ltd., Hsinchu (TW)

(72) Inventors: Kuo-Lung Hou, Taichung (TW); Wei-Chen Liao, Nantou County (TW); Ming-Hsien Lin, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/395,186

(22) Filed: Aug. 5, 2021

(65) Prior Publication Data

US 2023/0041439 A1 Feb. 9, 2023

(51) Int. Cl.
*C23C 14/54* (2006.01)
*C23C 14/14* (2006.01)
*C23C 14/35* (2006.01)
*H01J 37/34* (2006.01)

(52) U.S. Cl.
CPC ............ *C23C 14/54* (2013.01); *C23C 14/14* (2013.01); *C23C 14/35* (2013.01); *H01J 37/3476* (2013.01)

(58) Field of Classification Search
CPC ..... C23C 14/54; C23C 14/0068; C23C 14/34; C23C 14/564; C23C 14/14; C23C 14/35; C23C 14/3492; C23C 14/354; C23C 14/50; H01J 37/3476; H01J 37/32816; H01J 37/3299

USPC ....................... 204/298.07, 298.11
See application file for complete search history.

(56) References Cited

U.S. PATENT DOCUMENTS

2020/0090968 A1* 3/2020 Van Selow ....... H01L 21/67109

OTHER PUBLICATIONS

"Nut plate". Google Search and Google Definition. [https://www.google.com/search?q=nut+plate&rlz=1C1GCEB_en&oq=nut+plate&aqs=chrome..69i57j0i512l6j0i10i512j0i512l2.2336j0j1&sourceid=chrome&ie=UTF-8].*
"Plate nut" or "nut plate". Wikipedia.org [https://en.wikipedia.org/wiki/Plate_nut].*

* cited by examiner

*Primary Examiner* — Rodney G McDonald
(74) *Attorney, Agent, or Firm* — FOLEY & LARDNER LLP

(57) ABSTRACT

A chamber for a physical vapor deposition (PVD) apparatus includes a collimator configured to narrow filter sputtered particles into a beam, an electrostatic chuck configured to support a substrate in the chamber, a shield and a chamber plate. The chamber plate includes a nut plate portion having a plurality of nut plates and a plurality of cavities in the chamber plate that are configured to allow gas to ingress and egress, wherein the cavities and nut plates are provided in equal numbers. The chamber is configured to operate at a target pressure, and the number of nut plates and corresponding number of cavities are determined based on the target pressure.

20 Claims, 5 Drawing Sheets

PHYSICAL VAPOR DEPOSITION APPARATUS

BACKGROUND

The present disclosure generally relates to semiconductor devices and methods for fabricating semiconductor devices, and particularly to equipment used in the fabrication process for semiconductor devices.

A commonly used semiconductor fabrication process is physical vapor deposition (PVD), during which a thin film is formed on a substrate through a sputtering process. A sputtering process may occur by bombarding a sputtering target with highly energized ions (as in a plasma) to free particles from the sputtering target. The free particles then attach themselves to the substrate, thereby forming a thin film. During sputtering, the pressure of the chamber must be suitable for the plasma ignition to occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
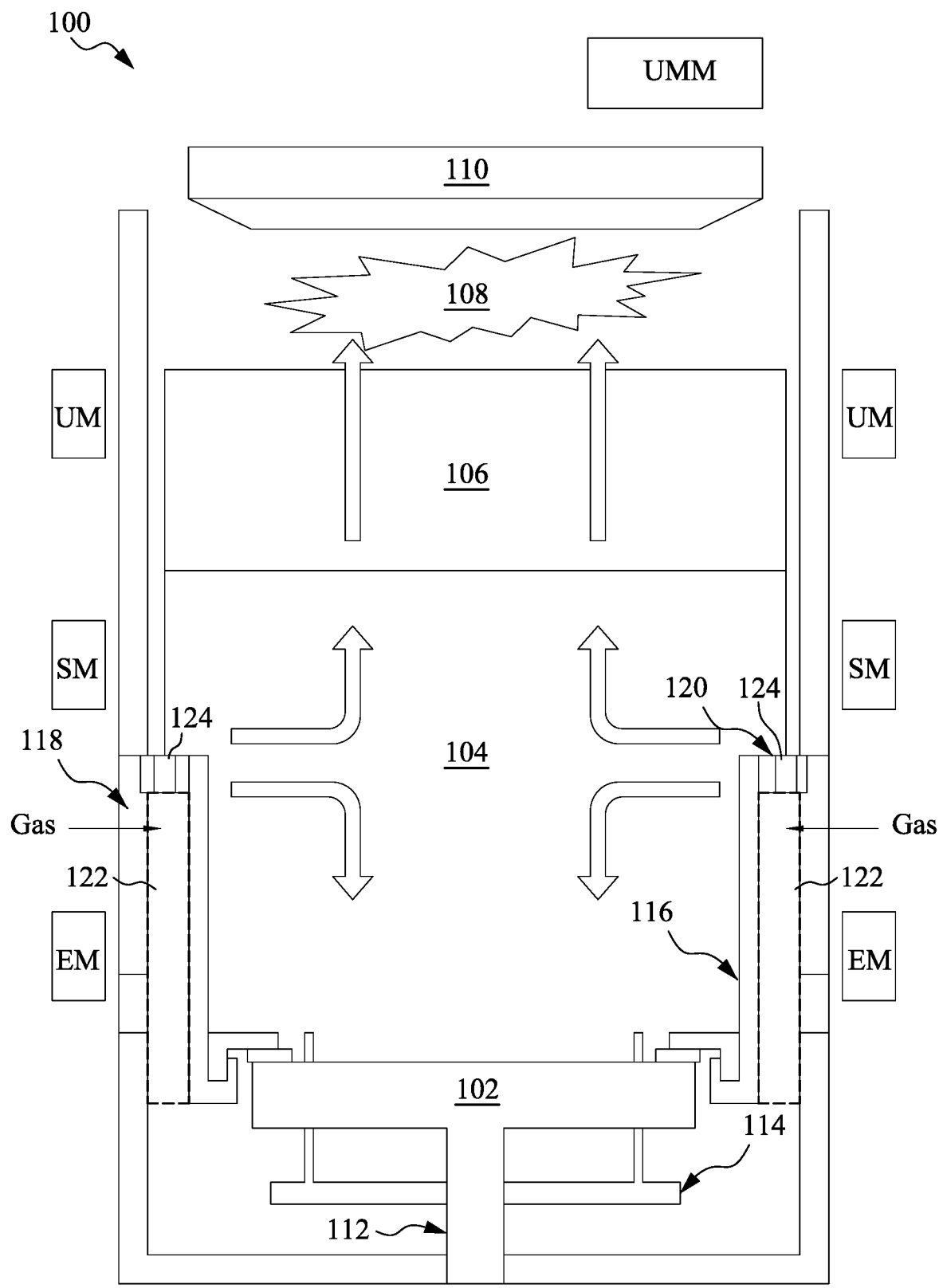
FIG. 1 is a schematic cross-sectional illustration of a physical vapor deposition apparatus, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a physical vapor deposition (PVD) apparatus having tunable nut plates to control target pressure within the PVD apparatus and improve plasma ignition. The PVD apparatus includes a chamber plate that has a nut plate portion with three separate nut plates with three corresponding cavities formed therebetween. When viewed in comparison with chamber designs that use a greater number of nut plates, this chamber plate design can provide smaller cavities, and thereby higher target pressure to improve plasma ignition.

FIG. 1 is a schematic cross-sectional illustration of a PVD apparatus 100, according to some embodiments of the present disclosure. PVD apparatus 100 is generally used to deposit material onto a substrate as part of the fabrication process of electronic circuits (e.g., integrated circuits) or other electronic semiconductor components. Examples of materials that can be deposited by PVD apparatus 100 include, without limitation, various metals, such as aluminum (Al), copper (Cu), tungsten (W), molybdenum (Mo), tantalum (Ta), and/or metal compounds, such as tantalum nitride (TaN), tungsten nitride ($W_2N$, WN, or $WN_2$), titanium nitride (TiN), aluminum nitride (AlN), scandium aluminum nitride (ScAlN or $Sc_xAl_{1-x}N$), and the like. In some embodiments, PVD apparatus 100 is an Endura machine as manufactured by Applied Materials, Inc. Although PVD apparatus 100 may be utilized for many different types of deposition, for the purpose of this disclosure, PVD apparatus 100 will be described with reference to an example in which a copper seed is used as the sputtering target.

PVD apparatus 100 includes a PVD chamber 104 for depositing a material from a sputtering target 110 onto a substrate during a PVD, or "sputtering," process. PVD chamber 104 is a high-vacuum chamber in which high-energy ions impact sputtering target 110, causing particles of target material to be ejected from sputtering target 110 and deposited as a film on the substrate. Sputter target 110 may be a copper seed, that is, a sample of pure copper to be deposited on a wafer to fill through silicon vias and form interconnects between circuit components formed on the wafer. The sputtering target 110 may be mounted on or coupled to an inner wall of PVD chamber 104 near a plasma ignition area 108. In some embodiments, sputtering target 110 is electrically separated from the wall of PVD chamber 104 by an insulator to protect the wall of the chamber. Sputtering target 110 may additionally be secured with a clamp or other fastening device.

The substrate may be placed on a substrate support 102 coupled to a lift mechanism 112 configured to lift the substrate closer to plasma ignition area 108. In some embodiments, substrate support 102 may be an electrostatic chuck disposed over or in contact with an electrode 114 configured to secure the substrate in place on substrate support 102 during the sputtering process. In some embodiments, electrode 114 may be embedded in the body of the electrostatic chuck. Substrate support 102 may be coupled to one or more deposition shields 116 to protect sputtered particles from attaching to walls or other parts of PVD chamber 104. Deposition shield 116 may also function as a dark space (e.g., space in PVD chamber 104 considered behind or below the substrate) shield, which protect PVD chamber 104 from electrical arcs due to the potential of the plasma reaching ground potential within the chamber. Substrate support 102 and deposition shield 116 may encircle a plasma processing area in the center of PVD chamber 104, disposed below plasma ignition area 108.

A collimator 106 (e.g., a flux optimizer) may be disposed between substrate support 102 and plasma ignition area 108. Collimator 106 may be configured to narrow the sputtered particles into a beam by allowing sputtered particles moving in a direction normal to the surface of the substrate to pass through and filtering out sputtered particles moving in a direction oblique to the surface of the substrate. Collimator 106 may achieve this by being formed with a mesh-like portion thick enough to capture sputtered particles moving in an oblique direction by a predetermined amount, such as a degree of deviation from the normal direction. By doing so, collimator 106 helps prevent sputtered particles from attaching to surfaces such as deposition shields 116 or the walls of PVD chamber 104. In some embodiments, collimator 106 is a biasable flux optimizer (BFO) configured to be electrically biased so as to control the electric field within PVD chamber 104 and thus the direction of the sputtered particles. Such a bias may be controlled by a power source (not shown). The power source may be a direct current (DC) power source configured to apply a DC voltage to collimator 106 as a voltage bias. The voltage bias may be a low voltage bias that is positive or negative depending on the type of sputtering target chosen or the gas pumped into the chamber.

PVD chamber 104 further includes valves 118 through which a gas, such as argon (Ar), enters PVD chamber 104. The gas may be chosen based on atomic or molecular mass of the sputtering target. For example, for a sputtering target with a high atomic or molecular mass, the gas may be chosen to have a comparable atomic or molecular mass. The gas may also be selected based on the type of reaction necessary to perform during sputtering. For example, unless the gas is intended to react with the sputtering target to create a compound for deposition on the wafer, typically a non-reactive gas such as argon (Ar) or another noble gas is chosen for the sputtering process. The gas fills PVD chamber 104 and is ignited in plasma ignition area 108 to create the plasma for sputtering. The pressure of PVD chamber 104, and particularly that near sputtering target 110, must be sufficient for ignition of the gas in plasma ignition area 108, otherwise the plasma may fail to ignite or the plasma may be unsustainable.

The gas is injected through valves 118 situated below or adjacent to chamber plate 120 into a region 122 defined by the chamber wall, deposition shield 116, and chamber plate 120. Chamber plate 120 includes at least one cavity 124 through which gas is pumped during the PVD process. The gas passes through cavity 124 disposed in chamber plate 120, which allows the gas to flow up into the plasma ignition area 108. Valves 118 may be disposed such that the gas flows from region 122 directly through the cavity 124 in chamber plate 120, building up gaseous pressure inside the chamber over time. Chamber plate 120 may be disposed adjacent to or in contact with an upper portion of deposition shield 116. Chamber plate 120 may include a nut plate portion including at least one nut plate. The nut plates of chamber plate 120 are configured to be tunable and control a size of a respective cavity disposed between adjacent nut plates. In the event of a single nut plate and a single corresponding cavity, the cavity may be disposed between two ends of the single nut plate.

In order to maintain the pressure inside the chamber, chamber plate 120 is limited in the number of nut plates to limit the total cross-sectional area of the cavities through which the gas may ingress or egress from the chamber, thereby enabling the chamber to retain a pressure over time during the PVD process. Thus, in some embodiments, chamber plate 120 is limited to three cavities and three corresponding nut plates to limit the amount of gas able to escape from the chamber. Three cavities allow significant tuning to adjust the cross-sectional area of the cavities to further limit or expand the movement of gas through chamber plate 120. Each additional cavity and corresponding nut plate in excess of three increases the likelihood of gas leakage and pressure drop in the chamber during the PVD process. Chamber plate 120 will described with further detail in reference to FIG. 2.

In some embodiments, PVD chamber 104 includes a plurality of sensors, such as a pressure sensor, a temperature sensor, a vibration sensor, or the like in order to monitor the conditions inside PVD chamber 104 during a sputtering process. Such sensors may be controlled by a processor configured to monitor the status of PVD chamber 104. The pressure sensor maybe a highly accurate sensor, such as a baratron. In order to keep the pressure maintained in PVD chamber 104, a magnetron may be disposed at the top of PVD chamber 104 to maintain the ionized plasma near sputtering target 110 and plasma ignition area 108.

PVD apparatus 100 may include a magnetron to establish an electric and magnetic field to confine charged plasma particles closer to the surface of sputtering target 110. The magnetic field allows the electrons generated from the ionized gas to follow helical paths around the magnetic field lines. As the electrons follow these paths, the number of ionizing collisions with gaseous neutral atoms increase ionization and deposition rate. The chamber may utilize Universal Magnet Motion (UMM), a type of target magnet rotation by creating a uniform electromagnetic field within PVD chamber 104, designated by three magnets, an electromagnet (EM), a side magnet (SM), and an upper electromagnet (UM). The purpose of the three magnets EM, SM and UM are to control the metal ions during the PVD process to ensure verticality of the metal ion deposition.

In some embodiments, PVD chamber 104 includes a plurality of sensors, such as a pressure sensor, a temperature sensor, a vibration sensor, or the like in order to monitor the conditions inside PVD chamber 104 during a sputtering process. A processor may be configured to collect data from these sensors and monitor the status of the PVD chamber 104. For example, the processor may notify a user of PVD apparatus 100 in the event of a temperature drop of PVD chamber 104, which may be indicative of an ignition failure or a lack of plasma in the chamber. The processor may further be configured to monitor the pressure, and may use a motor or actuator to tune the nut plates of chamber plate 120 to change the amount of gas that ingress or egress through the cavities, or can control gas valves 118 to increase the inflow while minimizing a size of the cavities to increase the pressure of chamber 104. The processor may be configured to determine tuning parameters, such as a tuning speed, a degree of tuning, or a rate of pressure change. These parameters may be based on process parameters such as a chamber size, a plasma type, a substrate type, or a sputtering target type.

Figure 2:
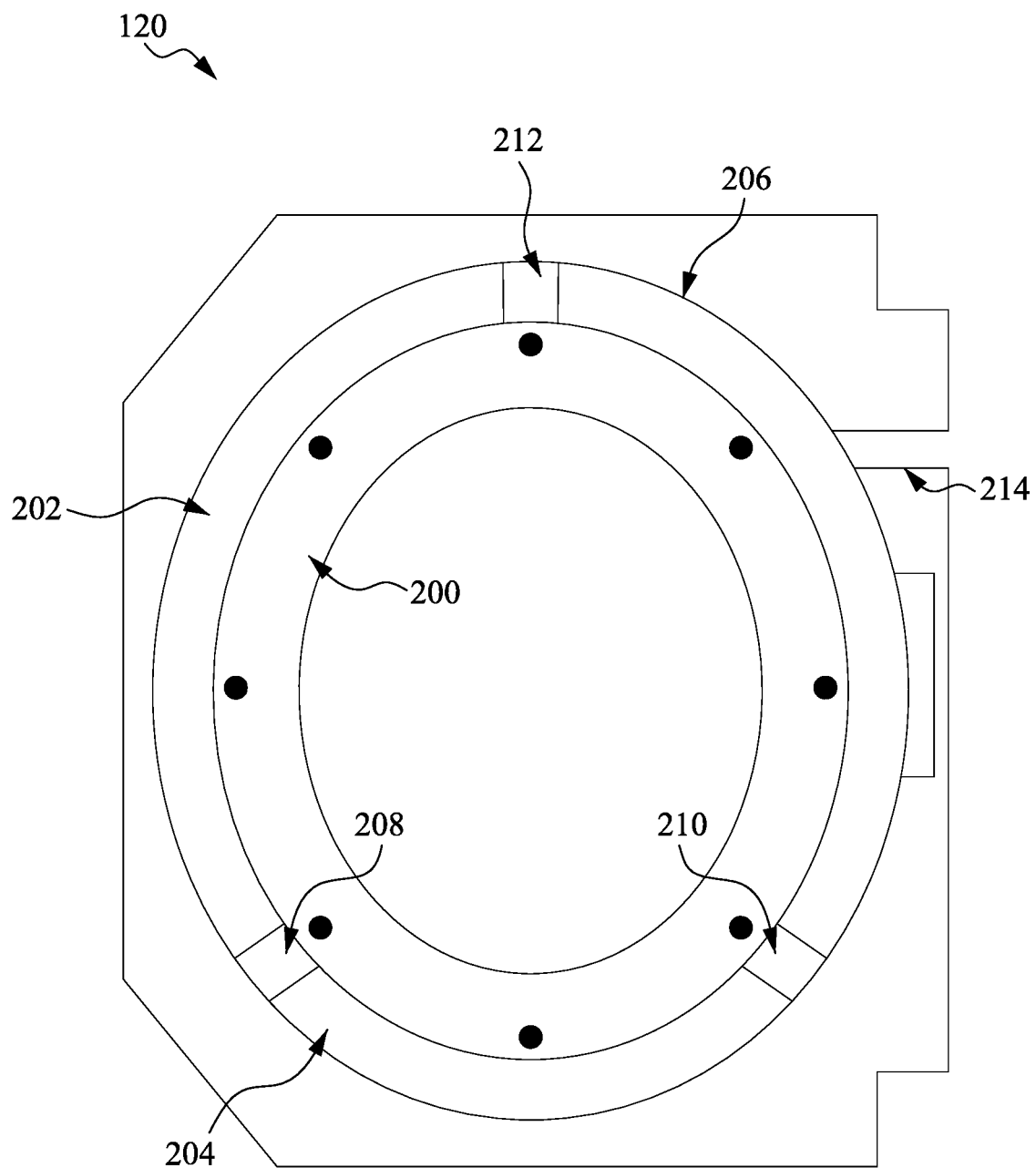
FIG. 2 is a schematic cross-sectional illustration a chamber plate of the physical vapor deposition apparatus of FIG. 1, according to some embodiments.

Referring now to FIG. 2, a diagram illustrating chamber plate 120 in more detail is shown, in accordance with some embodiments. As shown, chamber plate 120 connects to a shield 200 and a nut plate portion that includes a first nut plate 202, a second nut plate 204, and a third nut plate 206. Shield 200 may be the same as deposition shield 116 described with reference to FIG. 1. Also shown is a first cavity 208 that is disposed between first nut plate 202 and second nut plate 204, a second cavity 210 that is disposed between second nut plate 204 and third nut plate 206, and a third cavity 212 that is disposed between third nut plate 206 and first nut plate 202. The cavities may be disposed above or adjacent to a set of valves, such as valves 118 described with reference to FIG. 1, which are connected to a gas pump configured to pump gas into the chamber in which chamber plate 120 is disposed.

Nut plates 202, 204 and 206 may be tunable, such as with an actuator or by another mechanism to adjust the size of cavities 208, 210 and 212. In some embodiments, the nut plate portion of chamber plate 120 may have less than three nut plates. In such an embodiment, at least one nut plate is present. Chamber plate 120 may have an equal number of cavities and nut plates, such that each cavity is disposed between nut plate edges. When tuning nut plates 202, 204 and 206, the end portions may extend or recede according to a degree of the tuning that occurs, thereby reducing or enlarging the size of the cavity disposed between corresponding nut plates. For example, in the embodiment of FIG. 2, if nut plate 202 and nut plate 204 are tuned to extend their end portions, cavity 208 may reduce significantly in size; cavities 210 and 212 may be reduced in size by half that of cavity 208. In some embodiments, the nut plates may be tunable in context of the cavities; for example, in order to change the size of cavity 208, the end portion of nut plate 202 and the end portion of nut plate 204 adjacent to cavity 208 may change according to the degree of tuning.

Cavities 208, 210 and 212 may be configured to allow gas to ingress or egress from the dark space behind the substrate and shield. The gas may enter the dark space through a valve 214, and pass through cavities 208, 210 and 212 to increase pressure within the chamber. This action may be monitored by a pressure sensor coupled to a processor, which may determine the current operating pressure of PVD chamber 104 and compare it to a target pressure. In some embodiments, if the processor determines that the operating pressure is greater than the target pressure, the processor may tune one or more nut plates to increase a size of one or more corresponding cavities in chamber plate 120, thereby allowing a greater amount of gas to egress from the chamber into region 122. When the flow of gas out of the chamber is greater than the flow of gas into the chamber from valve 118, the overall pressure of the chamber will decrease. Alternatively, if the processor determines that the operating pressure is less than the target pressure, the processor may tune one or more nut plates to decrease the size of one or more corresponding cavities in chamber plate 120, thereby allowing a lesser amount of gas—or a negligible amount of gas—to egress from the chamber. When less gas is allowed to escape from the chamber during the process, the pressure inside the chamber will be maintained at a higher level. As such, when the overall amount of gas leaving the chamber is less than the amount being pumped in via valve 118, the pressure will increase. If the pressure inside the chamber is to be maintained at a particular level, the processor will tune the nut plates to a point at which the total gas ingress and egress is equal.

Figure 3:
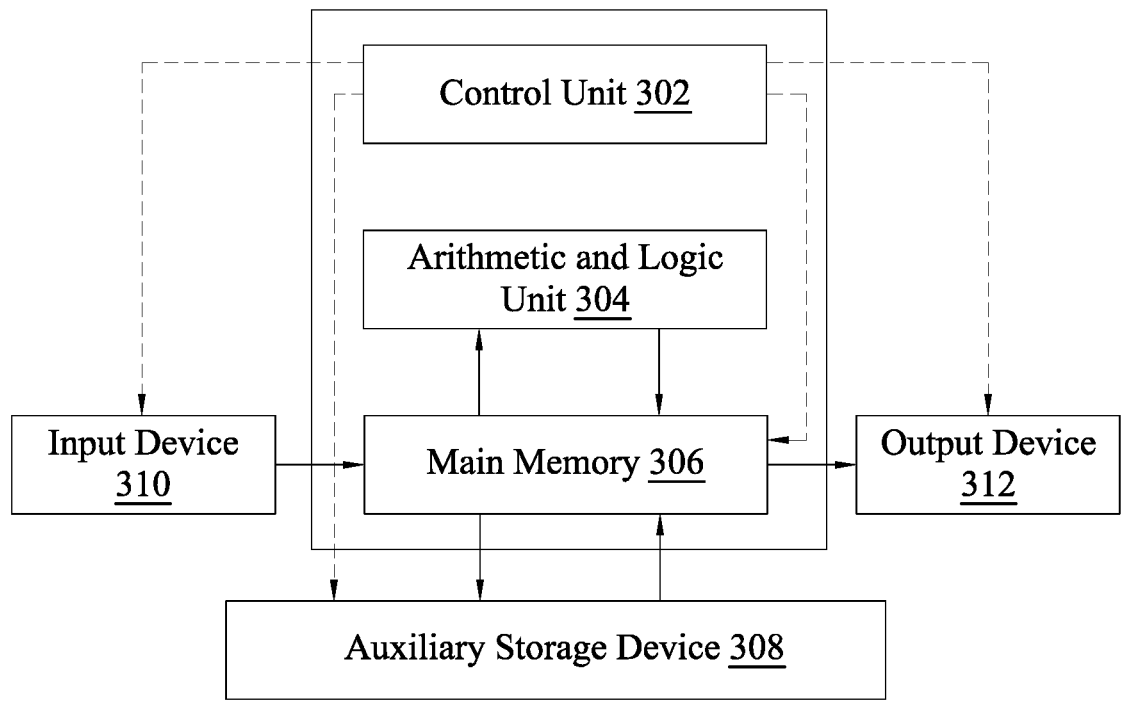
FIG. 3 is a block diagram illustrating a processor of the physical vapor deposition apparatus of FIG. 1, according to some embodiments.

Referring now to FIG. 3, a block diagram illustrating a computer architecture 300 for controlling the physical vapor deposition apparatus of FIG. 1. Architecture 300 may be any computing device capable of performing the actions described herein. For instance, architecture 300 may include a processing unit (e.g., control unit 302 and arithmetic and logic unit 304), and a non-transitory machine-readable storage medium (e.g., main memory 306 or auxiliary storage device 308). The processing unit may include a processor with a computer-readable medium, such as a random access memory (e.g., main memory 306) coupled to the processor. Architecture 300 may be executing algorithms or computer executable program instructions, which may be executed by a single processor or multiple processors in a distributed configuration. Architecture 300 may be configured to interact with one or more software modules of a same or a different type.

Non-limiting examples of the processor may include a microprocessor, an application specific integrated circuit, and a field programmable object array, among others. Architecture 300 may be capable of executing data processing tasks, data analysis tasks, and valuation tasks. Non-limiting examples of architecture 300 may include a desktop computer, laptop computer, tablet computer or the like coupled to the PVD apparatus. Architecture 300 may include control unit 302, arithmetic and logic unit 304, main memory 306, auxiliary storage device 308, an input device 310, and an output device 312. Architecture 300 may execute instructions to control the PVD process occurring within the PVD chamber.

Control unit 302 may be a controller configured to control each of the arithmetic and logic unit 304, main memory 306, auxiliary storage 308, input device 310 and output device 312. Control unit 302 may receive inputs via input device 310, which may be a user interface such as a touchpad, keyboard, control panel or the like connected the PVD chamber. Upon receiving an input, control unit 302 may fetch corresponding instructions from main memory 306 to determine tasks to be performed. Control unit 302 may decode the instruction retrieved from main memory 306 and send control signals to arithmetic and logic unit 304, auxiliary storage device 308, and output device 312 to perform necessary steps to execute the instructions. For example, an operator of the PVD apparatus may input values corresponding to characteristics of the PVD process through input device 310. The characteristics may include a type of gas, a type of sputtering target, and a target pressure to achieve inside the PVD chamber in order to maintain stable plasma ignition. In some embodiments, the target pressure may be calculated by arithmetic and logic unit 304 upon receiving a input of the type of gas and the type of sputtering target.

Upon receiving the input from the operator, the arithmetic and logic unit 304 may store the input gas and sputtering target information in auxiliary storage device 308, as well as the target pressure either input or calculated by arithmetic and logic unit 304 in a data record associated with the PVD process. The data record may be stored according to an identifier of the PVD process, such as a name chosen by the operator or an automatically generated string of characters representing the characteristics of the process or a timestamp of the process. The auxiliary storage device 308 may be long-term storage configured to periodically store the information temporarily stored in main memory 306 to enable the arithmetic and logic unit 304 to access the stored information at a later point in time.

Arithmetic and logic unit 304 may calculate, based on the target pressure received as an input, a tuning degree of the chamber plate. The tuning degree may be an amount of tuning relative to the current position of the nut plate, a final degree of tuning to be reached, a size of the cavity to be reached, or the like. Arithmetic and logic unit 304 may also generate characteristics of the tuning, such as a speed, rate of change of size of the corresponding cavity, rate of change of pressure to achieve, a time interval in which the tuning must be completed to prevent plasma ignition failure, or another characteristic control unit 302 may use to control output device 312. Output device 312, in a non-limiting example, may be a controllable actuator that performs automatic actuation of the nut plate to perform tuning. The actuator may be configured to operate the cavities similarly to valves using an opening or closing mechanism (e.g., a control valve) to control the size of the cavity. In some embodiments, output device 312 may simply control a degree of opening of a cover disposed over the cavity.

Control unit 302 may control auxiliary storage unit 308 to store the most recent value of the degree of tuning for reference. In a non-limiting embodiment, arithmetic and logic unit 304 may calculate the degree of tuning based on the parameters of the PVD process (e.g., target pressure, sputtering target, plasma gas, operating temperature, etc.), query the auxiliary storage device 308 to retrieve the most recent value indicative of the degree of tuning, and determine a difference between the two values. The control unit 302 then may send a control signal to output device 312 to adjust the tuning degree only by the difference amount. This may provide the additional benefit of minimizing the need for calibration of the cavity tuning amount prior to each PVD process in the event the tuning amount is surpassed or unreached during the PVD process.

Figure 4:
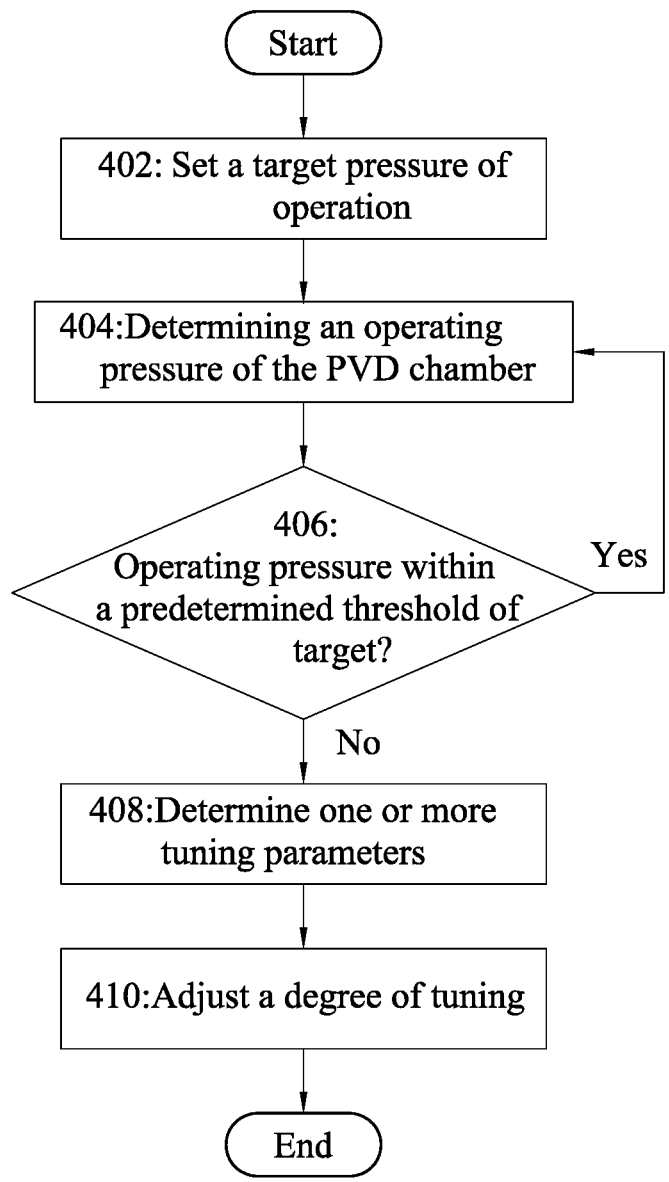
FIG. 4 is a flow chart illustrating a method of operating a physical vapor deposition apparatus including the chamber plate of FIG. 2, according to some embodiments.

Referring now to FIG. 4, a flow chart illustrating a method 400 for operating a PVD apparatus having a chamber plate with tunable nut plates is shown. Method 400 may be performed on a PVD apparatus such as PVD apparatus 100 described with reference to FIG. 1, using a chamber plate such as chamber plate 120 described with reference to FIGS. 1 and 2. For ease of description, method 400 may be described with reference to a general example of depositing copper through a sputtering process onto a target wafer.

Method 400 may begin with a step 402, in which a target pressure of operation of the PVD apparatus is set. The target pressure may be set by a user operating the PVD apparatus, using a processor described with reference to FIG. 1. In a non-limiting example, the target pressure may be determined based on the chosen sputtering target, a copper seed, and the gas may be argon gas. The target pressure of the chamber, which is at a near vacuum, may be designated as a value of pressure units such as atmospheres (atm) or Pascals (Pa). For the purpose of this example, the target pressure in the chamber is 0.01 Pa.

Method 400 may continue with a step 404, in which the operating pressure of the PVD chamber is determined. The PVD apparatus, using a processor or the like may be configured to monitor the operating pressure of the PVD chamber using sensors, such as those described with reference to FIG. 1. A current operating pressure based on a reading from a pressure sensor may be determined as part of step 404. Step 404 may be followed by a step 406, in which it is determined whether the operating pressure determined in step 404 is within a predetermined threshold of the target pressure determined in step 402. This may be determined by a processor or other computing device such as that described with reference to FIG. 2, and may be achieved by calculating a difference between the two pressures or by comparing to a simple minimum and maximum threshold. The predetermined threshold may be an upper and lower limit of pressure, a percent error, or an absolute value of the difference. As part of step 406, if it is determined that the operating pressure is within the predetermined threshold (yes in step 406), method 400 may return to step 404, and repeat steps 404 and 406 continuously to monitor the operating pressure of the chamber. If it is determined that the operating pressure is outside of the predetermined threshold (no in step 406), method 400 may continue to a step 408.

In context of the general example, steps 404 and 406 include taking a measurement of the chamber with a pressure sensor such as a baratron, which for the purposes of this description, is 0.089 Pa, and determining whether the current pressure measurement is within a predetermined threshold of 0.01 Pa, such as 5%. Therefore, an acceptable range of pressures would be anywhere between 0.0095 Pa to 0.0105 Pa. It will be appreciated that the embodiments described herein are not limited to such a threshold; an operator may adjust the threshold to a suitable range for the given PVD process. Step 406 would, in this example, determine that the current chamber pressure is outside of the predetermined range of acceptable values, and as such, proceeds to step 408.

When the operating pressure is outside of the predetermined threshold of the target pressure, the nut plates of chamber plate 120 must be tuned in order to achieve the desired pressure by changing the size of cavities 208, 210 and 212 described with reference to FIG. 2. In step 408, several tuning parameters to control the tuning of the nut plates are determined based on a chamber size, a type of sputtering target, a type of substrate, a type of plasma (e.g., type of gas pumped into the chamber), a temperature of the chamber, or other properties of the sputtering process. The tuning parameters may be a degree of tuning (e.g., a corresponding size of the cavities), a rate of change of pressure that must be achieved (e.g., an amount of pressure change over a predetermined time period), a speed of tuning of cavity size change, a number of nut plates to be adjusted, or the like that may be controlled by an actuator or control mechanism controlling the tuning. The tuning parameter may be determined by the processor of the PVD apparatus.

Returning to the general example, in step 408 it is determined that the cavities must be altered in size to raise the pressure in the PVD chamber to at least 0.0095 Pa from 0.0089 Pa. Thus, a computer, such as that described with reference to architecture 300 of FIG. 3, may calculate a degree of tuning necessary to reach the desired pressure. In some embodiments, the computer may determine that the target pressure must be reached in one minute or less, otherwise the plasma ignition source may fail. As such, the computer determines a rate of pressure change necessary to achieve (e.g., 0.0095-0.0089=0.0006 Pa over the course of one minute, or 60 seconds, 0.0006 Pa÷60 s=1×10$^{-5}$ Pascals per second. The computer may determine that the cavities must be adjusted 5 degrees (e.g., degree of turning a simple screw mechanism operating the cavity) for each 1×10$^{-5}$ Pa/s of rate of change, and as such, the degree of tuning of the nut plates is 5 degrees.

Method 400 may continue with a step 410, in which the degree of the tuning of the nut plates is adjusted according to the tuning parameters determined in step 408. The degree of tuning may be adjusted by a control device such as an actuator or the like that is controlled by a processor. In an example, an actuator may adjust the degree of tuning according to the calculate value determined in step 408. The actuator may be adjusted automatically in response to calculating a degree of tuning necessary, or may require input approving the change in the degree of tuning by an operator monitoring the PVD process. The degree of tuning may be stored temporarily by the processor such that when method 400 executes recursively, the stored value representing the degree of tuning may be updated accordingly. Method 400 may end at step 410, and repeat upon start of the PVD process.

Figure 5:
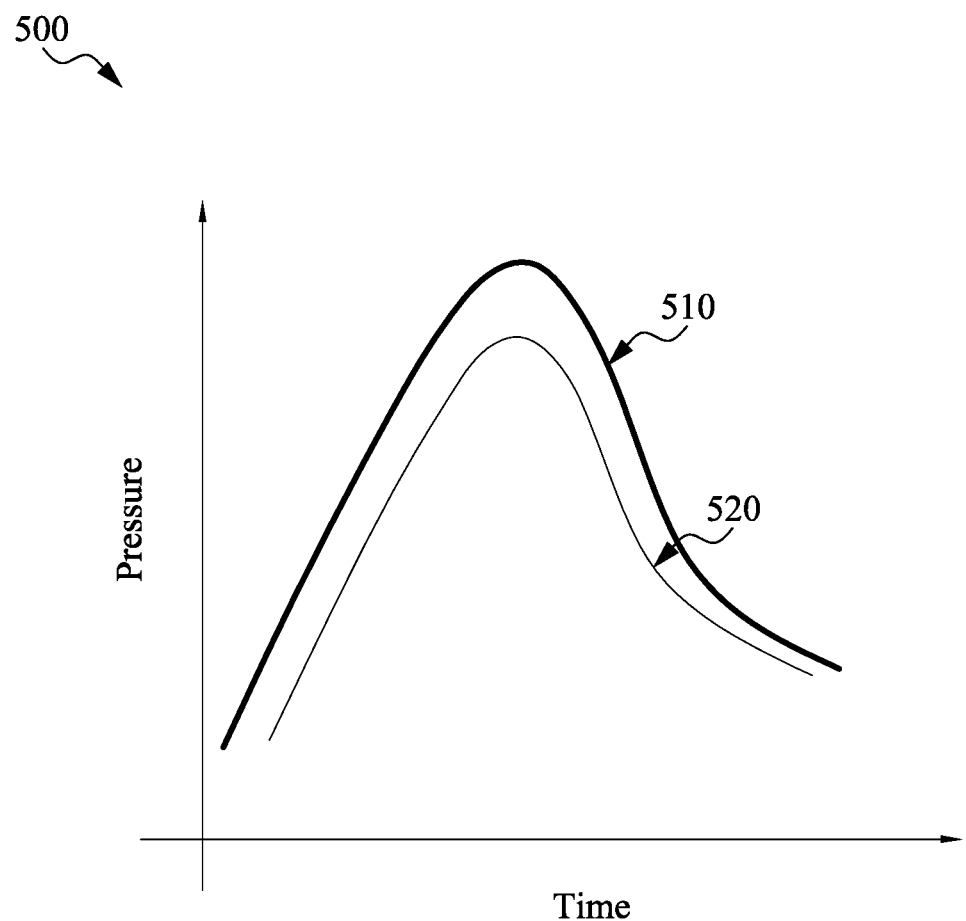
FIG. 5 is a graph comparing chamber pressure and target pressure of a physical vapor deposition apparatus including the chamber plate of FIG. 2, according to some embodiments.

Referring now to FIG. 5, a graph 500 illustrates chamber pressure in relation to target pressure in PVD chamber 104 operating according to method 400, in accordance with some embodiments. As shown, the y-axis of graph 500 indicates pressure, whereas the x-axis of graph 500 indicates time. The line 510 on graph 500 illustrates the actual pressure within PVD chamber 104 during plasma ignition, whereas the line 520 on graph 500 illustrates the target pressure that is desired to be provided within PVD chamber 104. As shown, the actual pressure depicted by line 510 closely follows the target pressure depicted by line 520. Because of the design of chamber plate 120, PVD apparatus 100 can provide high pressure within PVD chamber 104 to improve the plasma ignition process and create a precise film on a substrate.

As described in detail above, the present disclosure provides a physical vapor deposition apparatus with a tunable nut plate to control target pressure within the physical vapor deposition apparatus and improve plasma ignition. The physical vapor deposition apparatus includes a chamber plate that has a nut plate portion with three separate nut plates and three cavities formed between the nut plates. When viewed in comparison with chamber designs that use more nut plates, this chamber plate design can provide smaller cavities, and thereby higher target pressure to improve plasma ignition.

An implementation of the present disclosure a physical vapor deposition (PVD) apparatus. The PVD apparatus may optionally include a sputtering target from which sputtered particles are generated. The PVD apparatus may include a collimator configured to narrow filter sputtered particles into a beam. The PVD apparatus may include an electrostatic chuck configured to support a substrate in the chamber. The PVD apparatus may include an electromagnet. The PVD apparatus may include a shield. The PVD apparatus may include a chamber plate. The chamber plate may include a nut plate portion, the nut plate portion having a plurality of nut plates and a plurality of cavities formed in the chamber plate configured to allow gas to ingress and egress, wherein the number of cavities is same as the number of nut plates. The chamber plate may be configured to operate at a target pressure, and the number of nut plates and corresponding number of cavities are determined based on the target pressure.

Another implementation of the present disclosure is a chamber plate for a physical vapor deposition apparatus. The chamber plate includes a nut plate portion that includes a first nut plate, a second nut plate, and a third nut plate. The first nut plate, the second nut plate, and the third nut plate are configured to be tunable. The chamber plate further includes a first cavity disposed between the first nut plate and the second nut plate, a second cavity disposed between the second nut plate and the third nut plate, and a third cavity disposed between the third nut plate and the first nut plate.

Yet another implementation of the present disclosure is a method of operating a physical vapor deposition apparatus in which a chamber plate with tunable nut plates is disposed. The method may comprise setting a target pressure of operation of the PVD chamber. The method may comprise determining an operating pressure of the PVD chamber. The method may comprise determining, based on a result of comparing the operating pressure to the target pressure, one or more tuning parameters of the tunable nut plates. The method may comprise adjusting a degree of tuning of the tunable nut plates according to the tuning parameters to achieve the target pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a physical vapor deposition (PVD) apparatus comprising:
setting a target pressure of operation of a PVD chamber, wherein the PVD chamber includes a chamber plate with a plurality of nut plates surrounding the chamber plate, adjacent ones of the plurality of nut plates being separated with one another with a corresponding one of a plurality of cavities;
determining an operating pressure of the PVD chamber; and
adjusting, based on a result of comparing the operating pressure to the target pressure, a number of the nut plates to achieve the target pressure.

2. The method of claim 1, wherein the method further comprises, responsive to determining that the operating pressure is greater than the target pressure, reducing the number of the nut plates to increase a size of one or more of the plurality of cavities.

3. The method of claim 1, wherein the method further comprises, responsive to determining that the operating pressure is less than the target pressure, increasing the number of the nut plates to decrease a size of one or more of the plurality of cavities.

4. The method of claim 1, wherein the number of the nut plates is no greater than three.

5. The method of claim 1, further comprising determining, based on the result of comparing the operating pressure to the target pressure, one or more tuning parameters of the nut plates.

6. The method of claim 5, wherein the tuning parameters are further based on process parameters, the process parameters including a chamber size.

7. The method of claim 1, wherein the number of the nut plates is equal to a number of the cavities.

8. The method of claim 5, wherein the tuning parameters comprise at least one of a tuning speed, a degree of tuning, or a rate of pressure change.

9. The method of claim 5, wherein the chamber includes a sputtering target therein, and wherein the sputtering target is a metal seed of aluminum (Al), copper (Cu), tungsten (W), molybdenum (Mo), or tantalum (Ta).

10. The method of claim 1, wherein the number of the nut plates is no greater than three, thereby retaining the operating pressure of the PVD chamber over time during a PVD process.

11. A method of operating a semiconductor apparatus, comprising:
setting a target pressure of a chamber configured to deposit a material from a sputtering target through plasma, wherein the chamber includes a chamber plate with a plurality of nut plates surrounding the chamber plate, adjacent ones of the plurality of nut plates being separated with one another with a corresponding one of a plurality of cavities;

identifying an operating pressure of the chamber;

comparing the operating pressure to the target pressure; and determining, based on a result of the comparison, a number of the nut plates so as to cause the operating pressure to follow the target pressure.

12. The method of claim 11, further comprising responsive to determining that the operating pressure is greater than the target pressure, reducing the number of the nut plates to increase a size of one or more of the plurality of cavities.

13. The method of claim 11, further comprising responsive to determining that the operating pressure is less than the target pressure, increasing the number of the nut plates to decrease a size of one or more of the plurality of cavities.

14. The method of claim 11, wherein the number of the nut plates is no greater than three.

15. The method of claim 11, wherein the number of the nut plates is equal to a number of the cavities.

16. The method of claim 11, wherein the sputtering target is a metal seed of aluminum (Al), copper (Cu), tungsten (W), molybdenum (Mo) or tantalum (Ta).

17. The method of claim 11, wherein the number of the nut plates is no greater than three, thereby retaining the operating pressure of the PVD chamber over time during a PVD process.

18. The method of claim 11, further comprising igniting the plasma using the operating pressure.

19. A method of operating a semiconductor apparatus, comprising:

setting a target pressure of a chamber configured to deposit a material from a sputtering target through plasma, wherein the chamber includes a chamber plate with a plurality of nut plates surrounding the chamber plate, adjacent ones of the plurality of nut plates being separated with one another with a corresponding one of a plurality of cavities;

identifying an operating pressure of the chamber;

comparing the operating pressure to the target pressure;

determining, based on a result of the comparison, a number of the nut plates so as to cause the operating pressure to follow the target pressure; and igniting the plasma using the operating pressure.

20. The method of claim 19, wherein the number of the nut plates is no greater than three.

* * * * *